Figure 1:
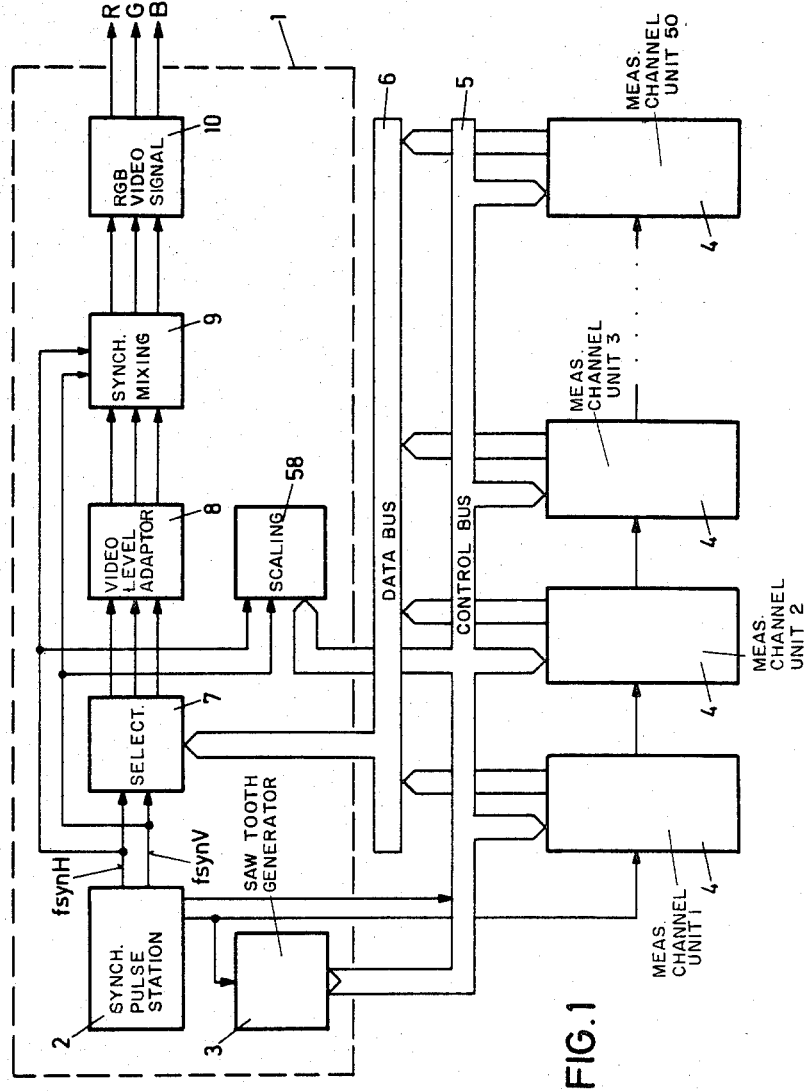

United States Patent [19]

Herweg

[11] Patent Number: 4,536,707
[45] Date of Patent: Aug. 20, 1985

[54] METHOD AND APPARATUS FOR DISPLAYING ONE OR MORE MEASUREMENT VALUES OF ARBITRARY MEASUREMENT VARIABLES ON A SCREEN

[76] Inventor: Arnulf Herweg, Grillenweg 44, D-8501 Feucht, Fed. Rep. of Germany

[21] Appl. No.: 420,247

[22] PCT Filed: Jan. 14, 1982

[86] PCT No.: PCT/DE82/00010
§ 371 Date: Sep. 14, 1982
§ 102(e) Date: Sep. 14, 1982

[87] PCT Pub. No.: WO82/02431
PCT Pub. Date: Jul. 22, 1982

[30] Foreign Application Priority Data

Jan. 15, 1981 [DE] Fed. Rep. of Germany ....... 3100986

[51] Int. Cl.³ ............................................. G01R 13/20
[52] U.S. Cl. ................................................. 324/121 R
[58] Field of Search .................... 324/121 R; 340/722, 340/747

[56] References Cited

U.S. PATENT DOCUMENTS

| | | | |
|---|---|---|---|
| 2,591,738 | 4/1952 | Spencer | 324/102 |
| 3,739,222 | 6/1973 | Hurd, III | 340/747 |
| 3,786,476 | 1/1974 | Graves et al. | 340/747 |
| 4,307,393 | 12/1981 | Hamada et al. | 340/722 |

Primary Examiner—Stewart J. Levy
Assistant Examiner—Stephen M. Baker
Attorney, Agent, or Firm—Browdy and Neimark

[57] ABSTRACT

The invention offers the opportunity of reproducing measurement values of arbitrary measurement variables, in color as well, on a screen and of storing them as needed. According to the invention, a measurement voltage (Ux) corresponding to a measurement variable is supplied to an adding amplifier (12), which is simultaneously supplied with a voltage (Us) of sawtooth-like course, which is synchronized by the frame-frequency pulses or line-frequency pulses (fsynV or fsynH), as a result of which if a threshold value is exceeded, a signal (tx) which is time-proportional to the measurement voltage (Ux) is emitted for further processing to a video signal. The reproduction of the measurement value (or values) on the video display terminal can take place in the form of a horizontal or vertical bar, and threshold value markers, scaling lines, character symbols and so forth can be reproduced as well.

36 Claims, 29 Drawing Figures

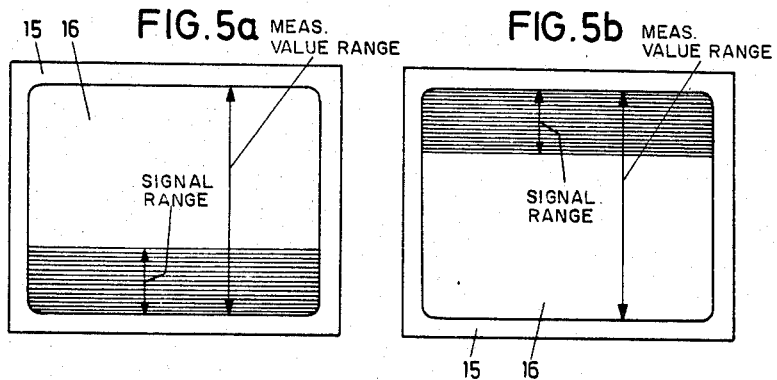
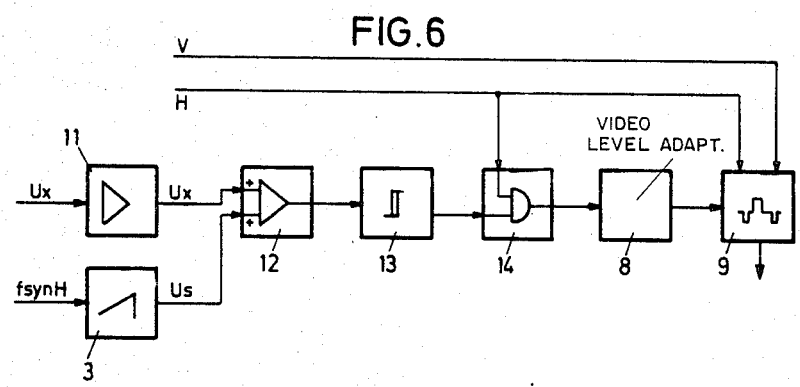
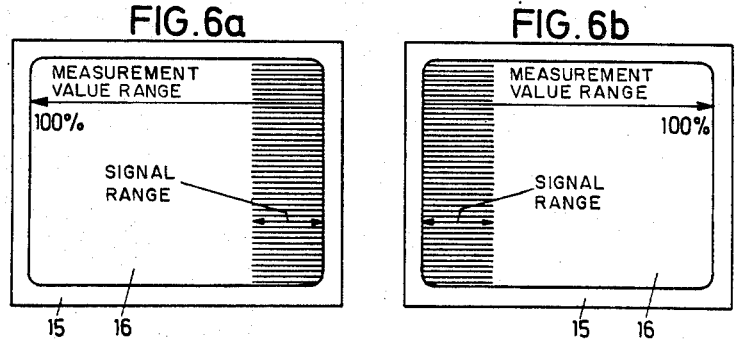

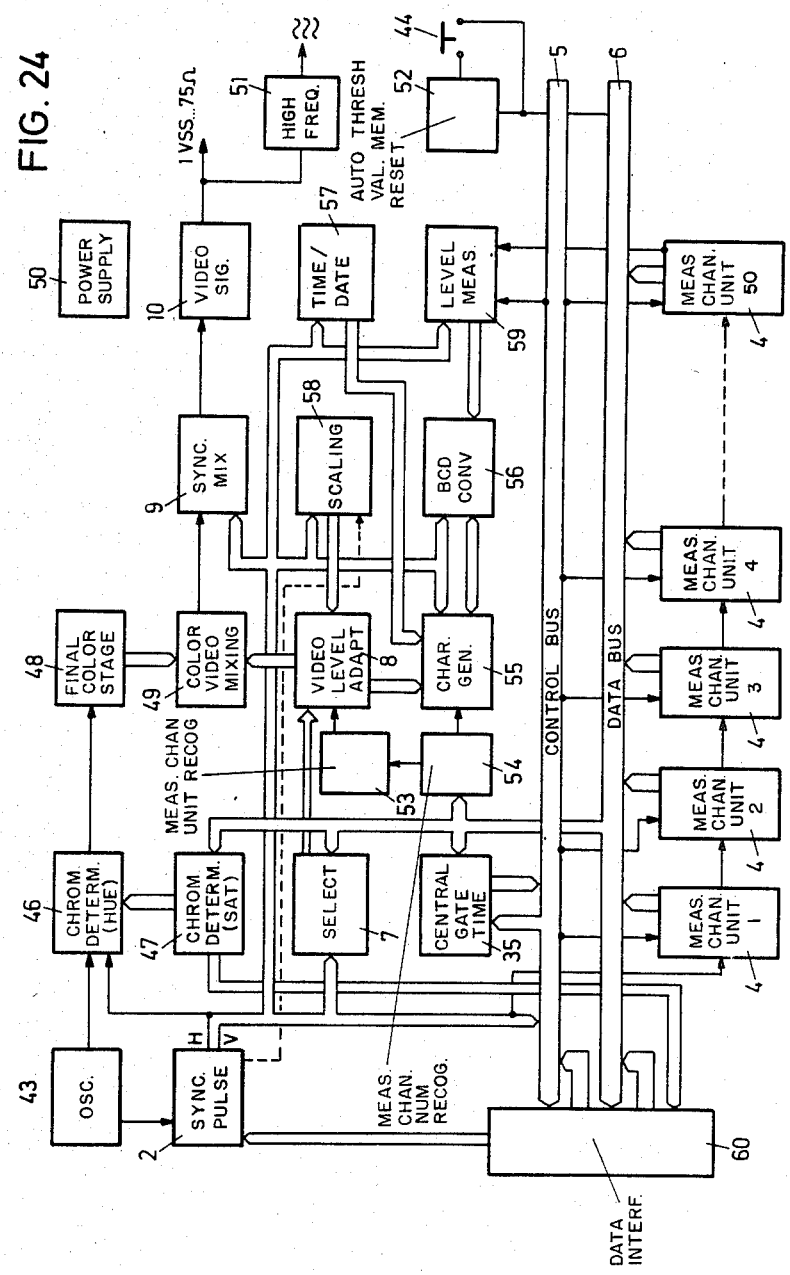

METHOD AND APPARATUS FOR DISPLAYING ONE OR MORE MEASUREMENT VALUES OF ARBITRARY MEASUREMENT VARIABLES ON A SCREEN

The invention relates to a method for displaying one or more measurement values of arbitrary measurement variables on the screen of a video display terminal (VDT), especially a color VDT, which operates by the line-scanning process. In the method according to the invention, line-frequency and frame-frequency signals are generated in a synchronizing pulse generator.

Methods for displaying measurement values and curves on the screens of VDTs are known. In a known apparatus, before beginning the display of the individual measurement or curve points in a given line, the measurement values to be displayed in this line are fed into an output register of a frame repetition memory. While the electron beam is scanning the screen, a frame counter is counted up with clock pulses until it has attained the measurement value stored in the output register. A picture element is then generated on the screen. Only one measurement value can be displayed in each line (German Laid-Open Application No. 1 808 245).

Based on this apparatus, a method is known with which measurement values can be displayed, the ordinate of which is perpendicular to the line direction and the abscissa of which extends in the same direction as the lines. To this end, the measurement values are transferred out of the frame repetition memory, as each line is scanned, in the order in which they are displayed (depending on the line direction). The measurement value which is to be displayed closest to the edge of the image field, depending on the line direction, is the first to be transferred out after each line return, and the measurement values are transferred out at an interval between lines such that from the transfer of one measurement value onto the screen until the transfer of the next, the electron beam travels a distance which is equal to the smallest interval between picture elements in the line direction. The transferred measurement values are compared with the negated state of a line counter, or the negated transferred measurement value is compared with the state of the line counter, and in the case of equality a signal is emitted (German Examined Application No. 2 149 636). A selective display of a curve from bottom to top or from left to right cannot be accomplished. Although in principle it is possible to rotate the deflection coil of the VDT by 90°, conventional VDTs could not then be used. The need frequently exists to display a relatively great number of measurement values clearly and simultaneously, and threshold values and/or actual and set-point values may also need to be shown at the same time.

It is accordingly the object of the invention to provide a method and an apparatus of the type discussed at the outset, such that one or more measurement values can be displayed selectively in a simple manner, horizontally or vertically and from top to bottom or from left to right with respect to the screen. Particularly when a color VDT is used, the various measurement values are displayed in different colors, depending upon whether they exceed a threshold value. The method is intended to enable easy adaptability to given measurement tasks and should enable the storage of measurement values in memory.

This object is attained according to the invention, in a method of the general type discussed at the outset, substantially in that a measurement voltage corresponding to a measurement variable is formed, then is first standardized and then supplied to an adding amplifier to which a sawtooth voltage is also supplied; that the sawtooth voltage is synchronized by the frame-frequency or line-frequency pulses; and the output voltage of the adding amplifier is supplied to a threshold switch, which if the threshold is exceeded by the summed voltage emits a time-proportional signal; that the signal proportional to the measurement voltage is delivered to a subsequent gate circuit which is synchronized with the line-frequency or frame-frequency pulses and, after adaptation of the level and mixing of the synchronizing pulses, is furnished as a video signal to the VDT.

By synchronizing the sawtooth voltage either by the frame-frequency pulses or selectively by the line-frequency pulses, either a vertical or a horizontal display of the measurement value or values is produced on the screen. If sawtooth voltages with an ascending edge are used, then the display of the measurement values is effected from bottom to top; if the sawtooth voltages used have a descending edge, the display is from top to bottom. The same applies analogously to displaying the measurement values horizontally. By thus L generating a time-proportional signal in accordance with the invention, expensive counting apparatus and multiplexing circuits are avoided.

It is therefore advantageous for the sawtooth voltage to have an ascending edge and to be synchronized with the frame-frequency pulses or a frequency corresponding to the frame-frequency pulses, so that the display of the measurement value on the screen of the VDT increasingly takes place from bottom to top.

In order to achieve a display from top to bottom, it is advantageous for the sawtooth voltage to have a descending edge and to be synchronized with the frame-frequency pulses or a frequency corresponding to the frame-frequency pulses.

In order to display information from right to left, it is advantageous for the sawtooth voltage to have an ascending edge and to be synchronized with the line-frequency pulse or a frequency corresponding to the line-frequency pulses.

For displaying the measurement value such that it increases from left to right, it is advantageous, in accordance with a modification of the invention, for the sawtooth voltage to have a descending edge and to be synchronized with the line-frequency pulses or a frequency corresponding to the line-frequency pulses.

In a further embodiment of the invention, it is advantageous in displaying threshold values for the gate circuit to be supplied additionally with a threshold value signal, which by supplying an adjustable fixed voltage to an adding amplifier, to which a sawtooth voltage is also supplied, this sawtooth voltage is synchronized by the frame-synchronizing pulse or the line-synchronizing pulse, and which analogously to the generation of the measurement signal by a threshold switch generates a threshold value signal that is time proportional to the threshold value.

A simplification in terms of circuitry is attained if in accordance with a further characteristic of the invention the sawtooth voltage for forming the measurement value signal and the formation of the threshold value is formed by a common time-base generator.

A still further embodiment of the invention provides that in order to display a threshold value marker on the screen of the VDT if the measurement voltage is absent or is less than the threshold value, a time-proportional threshold value marker signal is generated and supplied to the measurement value signal and to the gate circuit.

In order to store particular events in memory, it is advantageous if a threshold value memory is activated whenever a given threshold value is exceeded by the measurement signal.

The embodiment is intended to be such that the threshold value memory is erased, either selectively or automatically, by a reset pulse.

When a color VDT is used, it is advantageous in a further embodiment of the invention for the pulses traveling through the gate circuit to be delivered to a selector circuit, which has red, green and blue (R, G, B) outputs belonging to the color channels of a color VDT and emits output signals, in accordance with the magnitude of the threshold value and/or of the measurement value, to the outputs corresponding to the threshold value or the measurement value, respectively, and for the RGB signals to be delivered to the VDT either directly or, with an appropriate conversion, in the form of F-BAS signals and/or, via an HF circuit, in the form of a standardized HF color signal.

In a further embodiment it is advantageous that in order to display a plurality of threshold values and/or measurement values simultanously, each measurement value is assigned one measurement-value channel, and this channel is assigned a gate circuit; that the gate circuit of a first measurement-value channel is furnished with a gate time pulse which is synchronous with the frame or the line and is formed in a gate time circuit by means of a monostable or bistable multivibrator; and that gate time pulses which are associated with the individual measurement signals are delivered in sequence over time to the next subsequent gate time circuit of the next measurement channel.

In order to utilize a particular field on the screen for displaying the measurement values, it is advantageous if the total time of one or all gate time pulses is equal to or less than the time of one line on the screen of the VDT.

In horizontal display, it is advantageous if the total time of one or all gate time pulses is equal to or less than the time of one frame on the VDT.

The invention also relates to an apparatus for displaying one or more measurement values of arbitrary measurement variables on the screen of a video display terminal (VDT), in particular a color VDT, which operates by the line-scanning process and in which line-frequency and frame-frequency signals are generated in a synchronizing pulse generator; the apparatus is intended in particular for performing the method according to the invention and it has a power supply unit and a synchronizing pulse generator. The apparatus according to the invention is characterized by a base unit, containing the synchronizing pulse generator, a video level adaptor circuit and a synchronizing mixing circuit, and characterized by at least one measurement channel unit, in which a measurement voltage amplifier standardizing a measurement voltage is disposed. The measurement channel unit further includes an adding amplifier, to which the measurement voltage on the one hand and on the other a sawtooth voltage generated by a time-base generator are supplied via a decoupling amplifier; a threshold switch, to which the summed voltage of the adding amplifier is delivered; and further includes a gate circuit synchronized with the line-frequency or frame frequency pulse, an output signal of the threshold switch [garbled German--Tr.], the gate circuit providing a video signal output circuit with a measurement value signal proportional to the measurement value, on the basis of which signal a video signal is formed in the synchronizing pulse mixing circuit.

The apparatus according to the invention makes it possible, using a given base unit and a given VDT, to connect a number of measurement channel units selectively as needed, so that great adaptability to a given measurement task is attained.

In a preferred manner, the gate circuit is an AND gate, a NAND gate or, if a plurality of measurement channel units is used, a tristate.

In a further embodiment of the apparatus according to the invention, a treshold value transducer may be provided, in which a first amplifier is supplied by an adjustable fixed-voltage source with a threshold value voltage, that further an adding amplifier is provided for forming a summed voltage from the threshold value voltage and a sawtooth voltage generated by a time base generator and a threshold switch is disposed subsequent to the adding amplifier, the output of the threshold switch being connected with the gate circuit.

It is particularly efficacious if at least one threshold value transducer is provided in each measurement channel unit.

In order to store measurement values in memory or if a threshold value is exceeded by the measurement voltage, it is advantageous to provide a flip-flop circuit, which is set by a synchronizing pulse and is reset after the measurement time has elapsed, in order to generate a measurement signal which is proportional to the measurement value and is independent of the measurement voltage when the flip-flop is in the set state.

In accordance with a modification of this switching circuit, it is advantageous to provide a monostable multivibrator started by synchronizing pulses; the time-determining resistor of the RC member is a constant-current source controlled by the measurement voltage.

In order to generate a measurement signal and a threshold value signal, it is advantageous for the resistor of the RC member of the monostable multivibrator to be embodied as a potentiometer which is adjustable either arbitrarily or by the measurement value.

The circuit layout is simplified if a common time-base generator is assigned to all the threshold value transducers and all the measurement value transducers, and if a decoupling amplifier is provided in each threshold value transducer circuit and each measurement value circuit. The decoupling amplifier is advantageously also suitable for the linearization of nonlinear measurement values.

Since in general, each measurement channel displays the measurement value on the screen in the form of a bar, it is advantageous for distinguishing the measurement values from one another if the time-base generator is embodied as a stairstep generator.

In an advantageous further development, one threshold value marker transducer, in each measurement channel having a threshold value transducer, is coupled with the threshold value transducer and the gate circuit, efficaciously via an OR gate or diode gate, in order to prevent malfunctioning of subsequently disposed circuits. For distinguishing the measurement values chromatically depending upon their size on the screen of a color VDT, it is advantageous if the gate circuit or circuits are followed by a selection circuit having NAND gates and inverter circuits.

For the long-term ascertainment of occasions where a given measurement value exceeds the adjustable threshold values, it is advantageous for each threshold value transducer to be assigned a threshold value memory.

The threshold value memories are advantageously embodied as bistable multivibrator circuits, which are set upon the attainment or exceeding of the threshold value by the measurment value and are selectively reset individually either by hand or in a pulse-controlled manner. For selectively adjusting the width of the bar-like display of the measurement values on the screen, it is advantageous if a gate time circuit is provided for limiting the display time of the measurement value and of the threshold values on the screen of a VDT connected to it, for a portion of the time required for scanning one line. The gate time circuit has a monostable multivibrator started by the line pulse, and the transit time of the monostable multivibrator $\leq$ the line duration.

In an advantageous manner, for the sake of displaying a plurality of measurement values in common on the screen of the VDT, one measurement channel unit is provided per measurement value; the measurement channel unit has a gate time circuit, which controls a given gate circuit and after the gate time has elapsed emits a starting pulse to the next measurement channel unit in sequence.

In order to simplify the circuitry, it is advantageous to provide a central gate time station, which is disposed by way of example in a base unit, and if the gate time circuit of a first measurement channel is started by this central gate time station and, after its gate time has elapsed, emits a starting pulse to the gate time circuit of the next measurement channel unit in sequence and to the central gate time station.

An advantageous simplification in terms of circuitry is attained if in accordance with a further embodiment of the invention the base unit and the measurement channel units are connected on the one hand via a data bus, to which the measurement values, threshold values, threshold value pulses and the like are supplied by the measurement channel units, and on the other hand via a control bus, to which the synchronizing pulses, the sawtooth voltage if applicable and the gate time pulses are supplied by the base unit for emission to the measurement value channels.

If a color video display terminal is used, it is advantageous if the measurement values, threshold values and the like emitted by the data bus to the selection circuit are emitted, following the selection circuit, in the form of R, G and B signals and then are converted both into standardized R, G and B signals and also into an FBAS signal. These signals may also be stored using a video recorder.

When a selection circuit is used, the measurement values, threshold values and the like undergo a simultaneous and definite coordination.

Since the measurement values, threshold values and the like undergo a common and simultaneous coordination following the selection circuit, these values can be supplied before and after the selection circuit, in still another embodiment of the invention, to a data interface for further processing in a data memory or a data processing unit.

In order to generate fixed and variable scaling lines on the screen, it is advantageous to generate these lines in the same manner as the threshold value markers. In order to generate these lines, it is also possible to use switching circuits known per se. A selectively actuatable character generator may be provided as well.

In particular, it is advantageous for a circuit unit to be additionally provided for the selective display of time and/or date on the screen of a VDT or for storage together with the measurement value signals and the like on a video tape or some other memory means.

Figure 2:
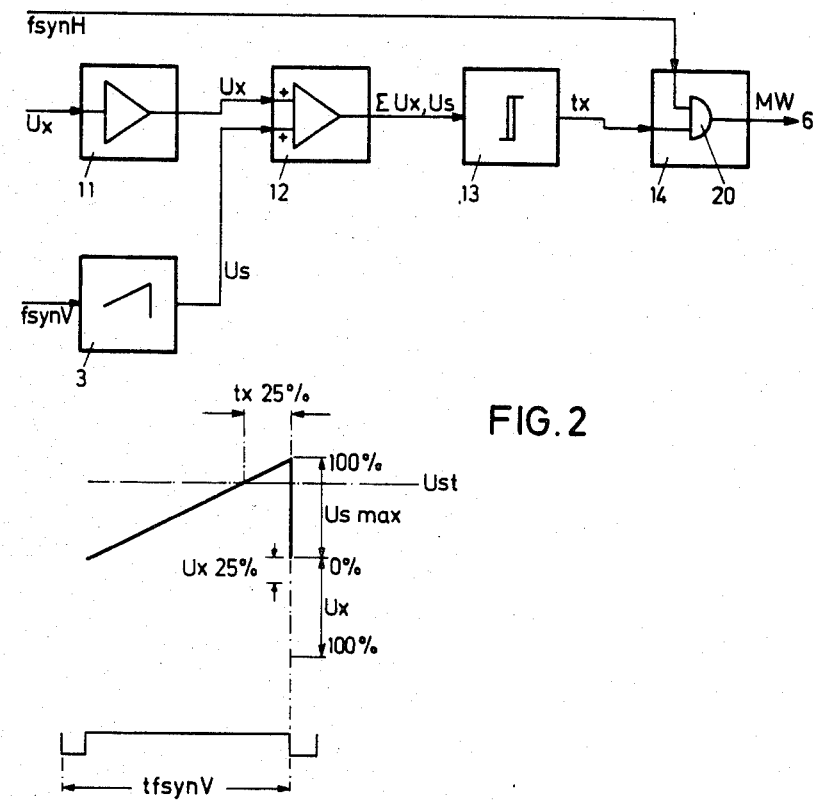
Figure 3:
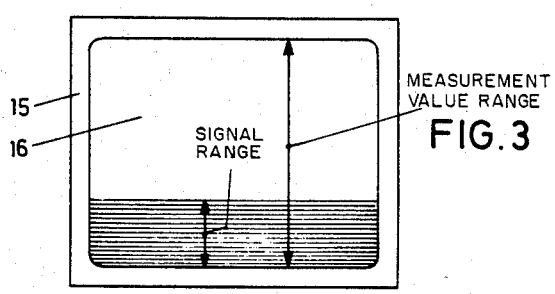
Figure 4:
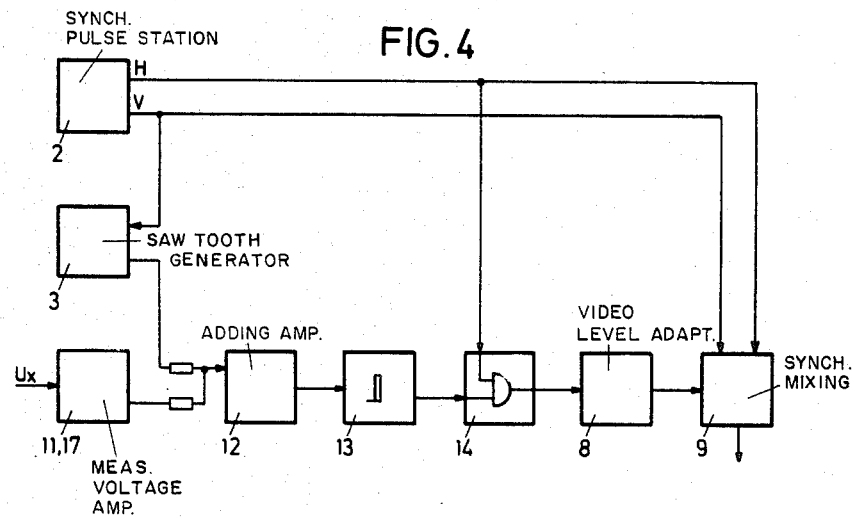
Figure 5:
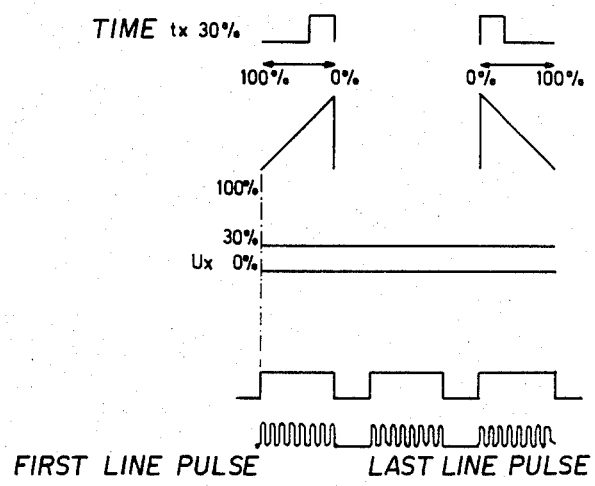
Figure 7:
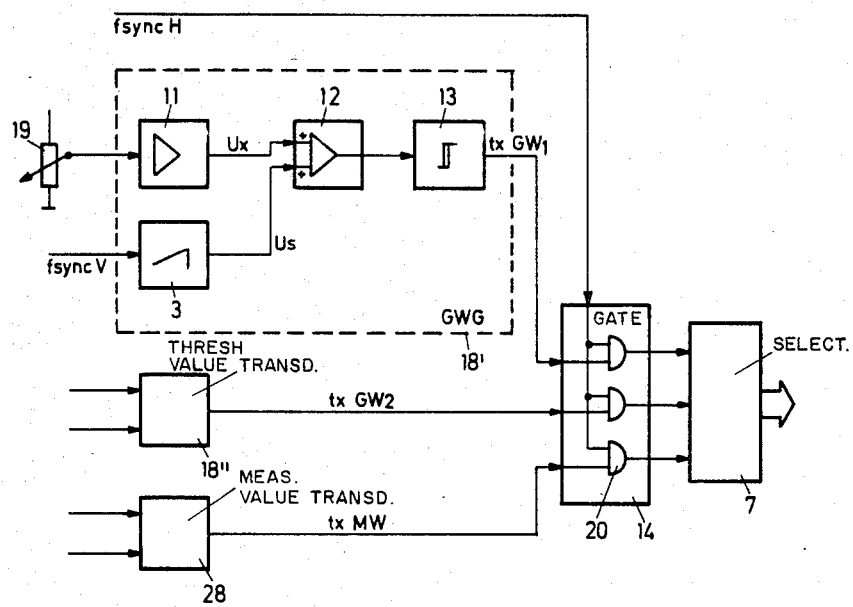
Figure 8:
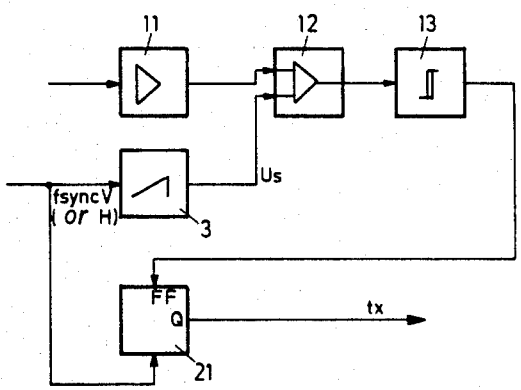
Figure 9:
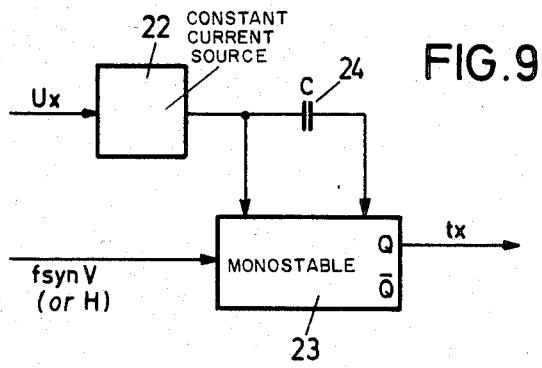
Figure 10:
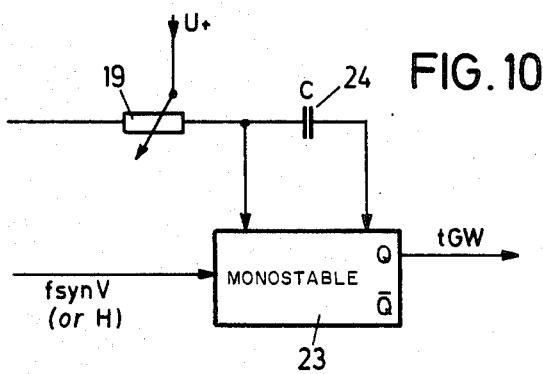
Figure 11:
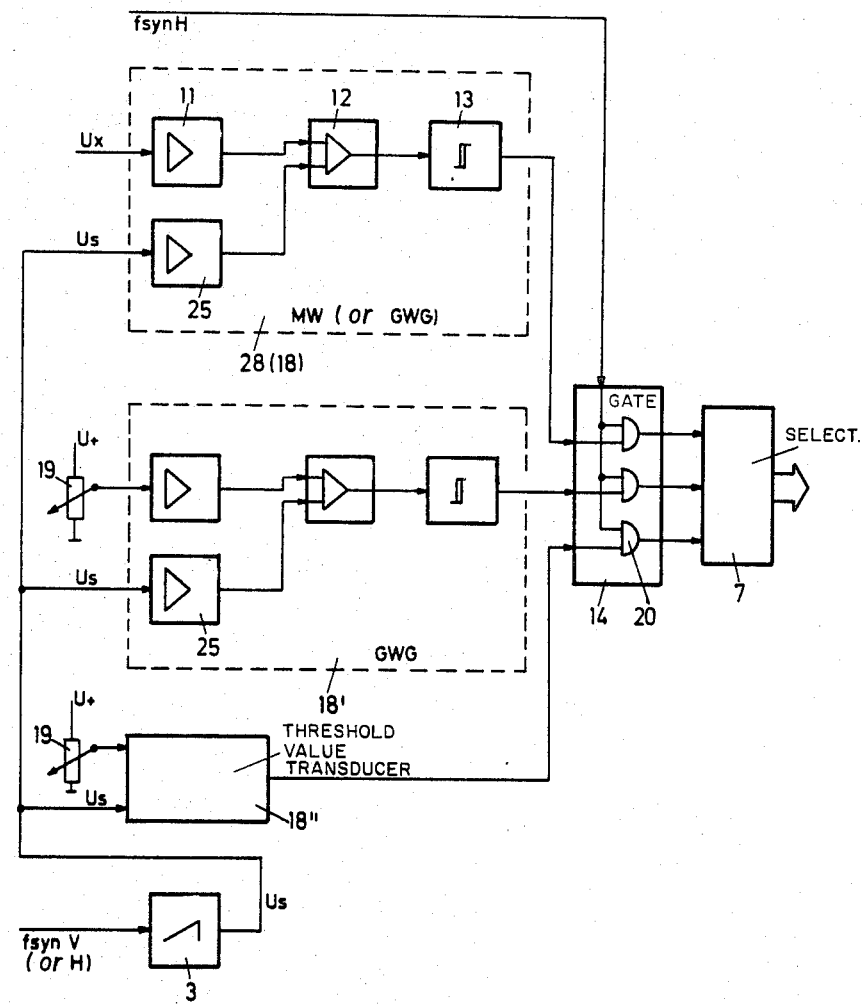
Figure 19:
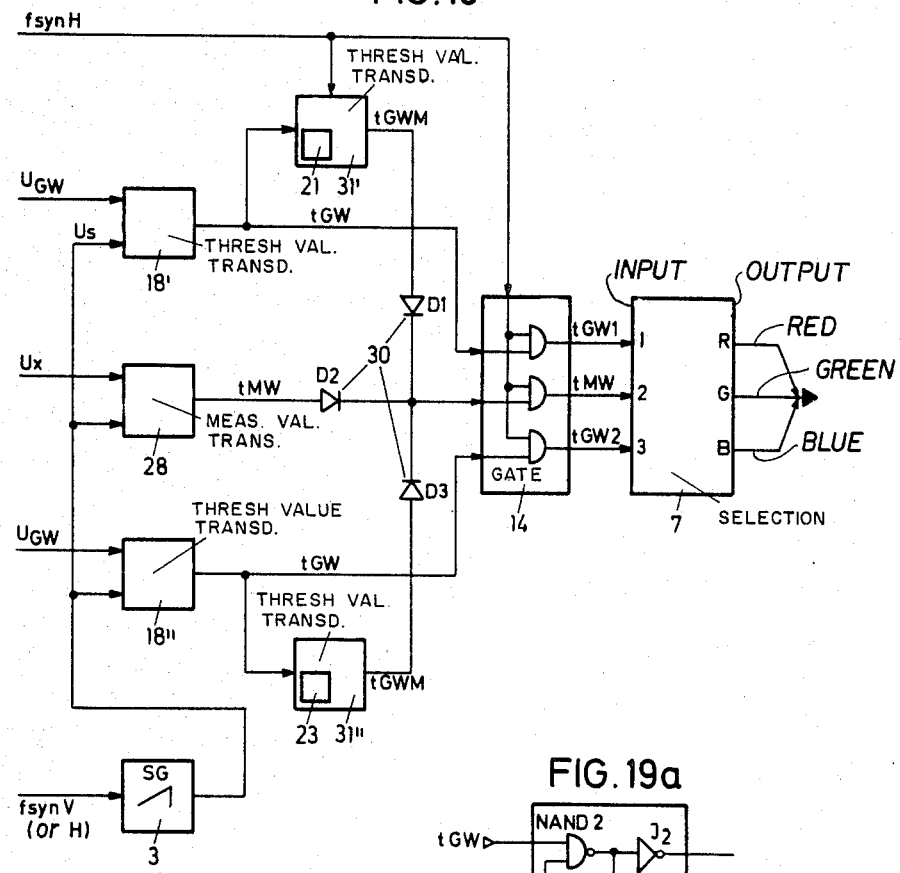
Figure 19A:
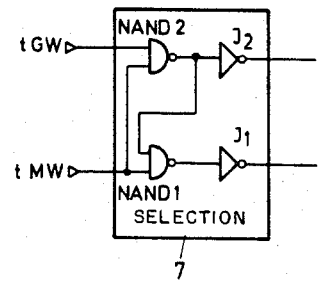
Figure 20:
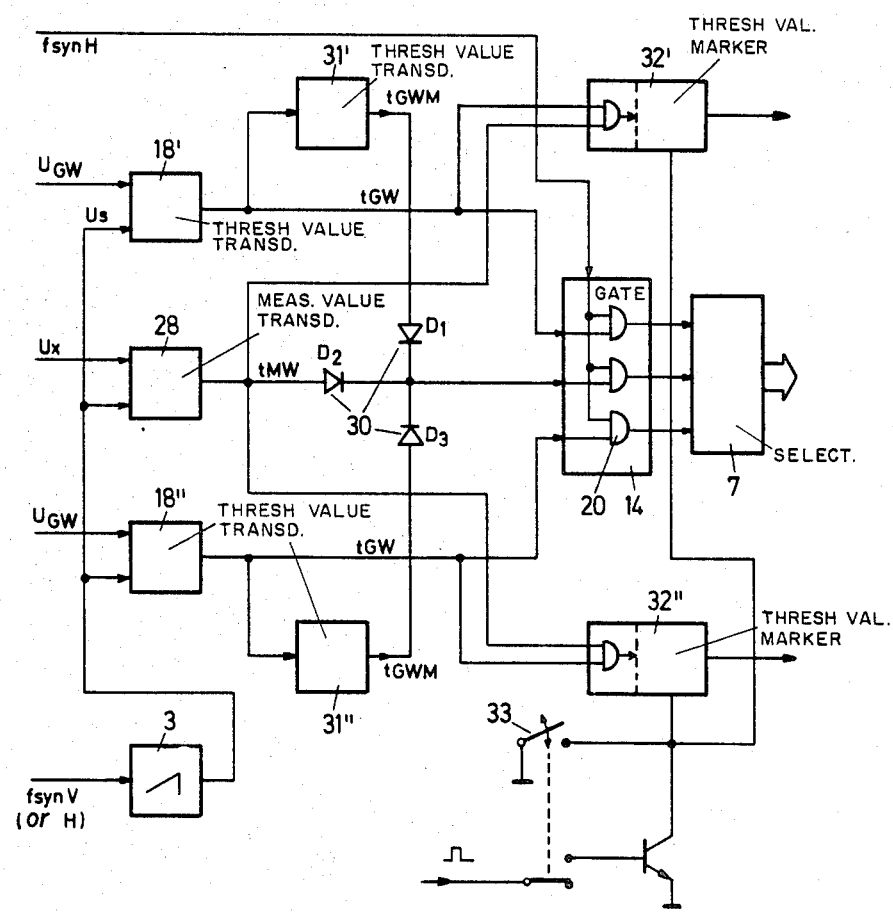
Figure 21:
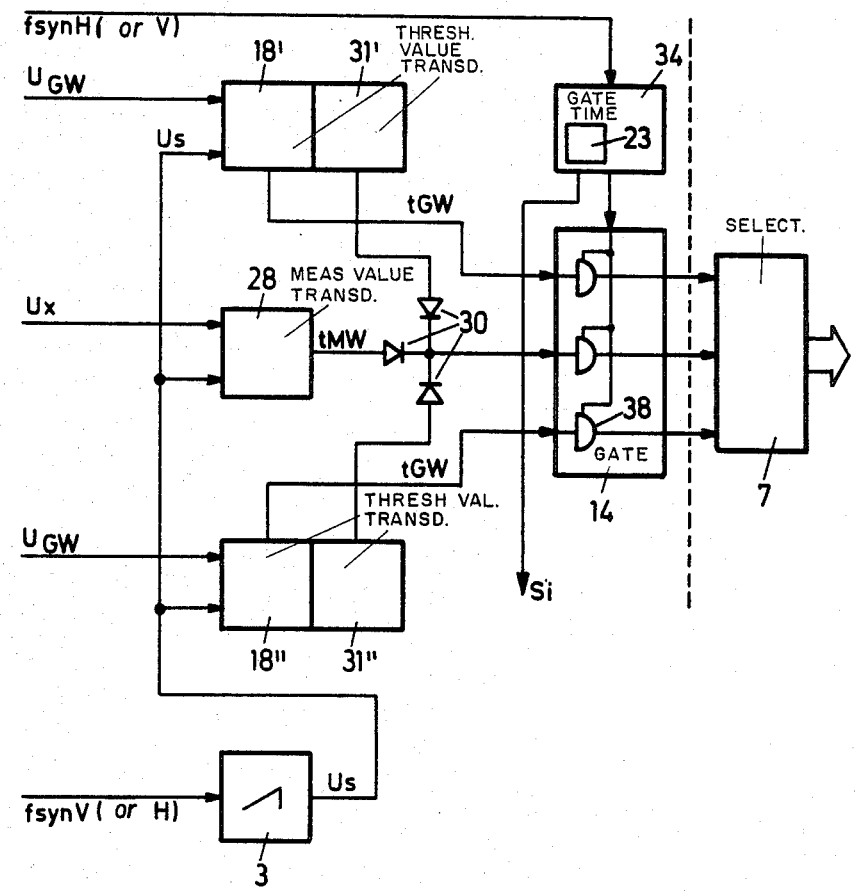
Figure 22:
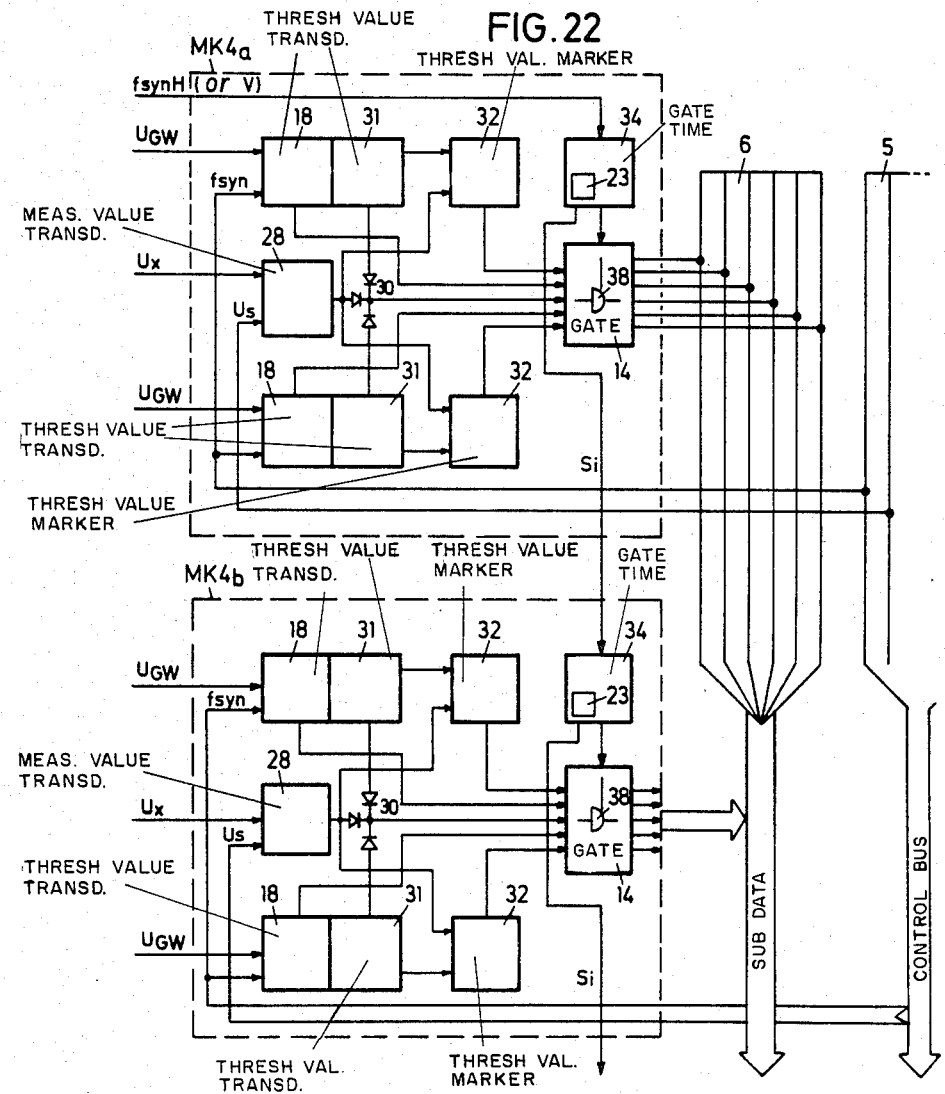
Figure 23:
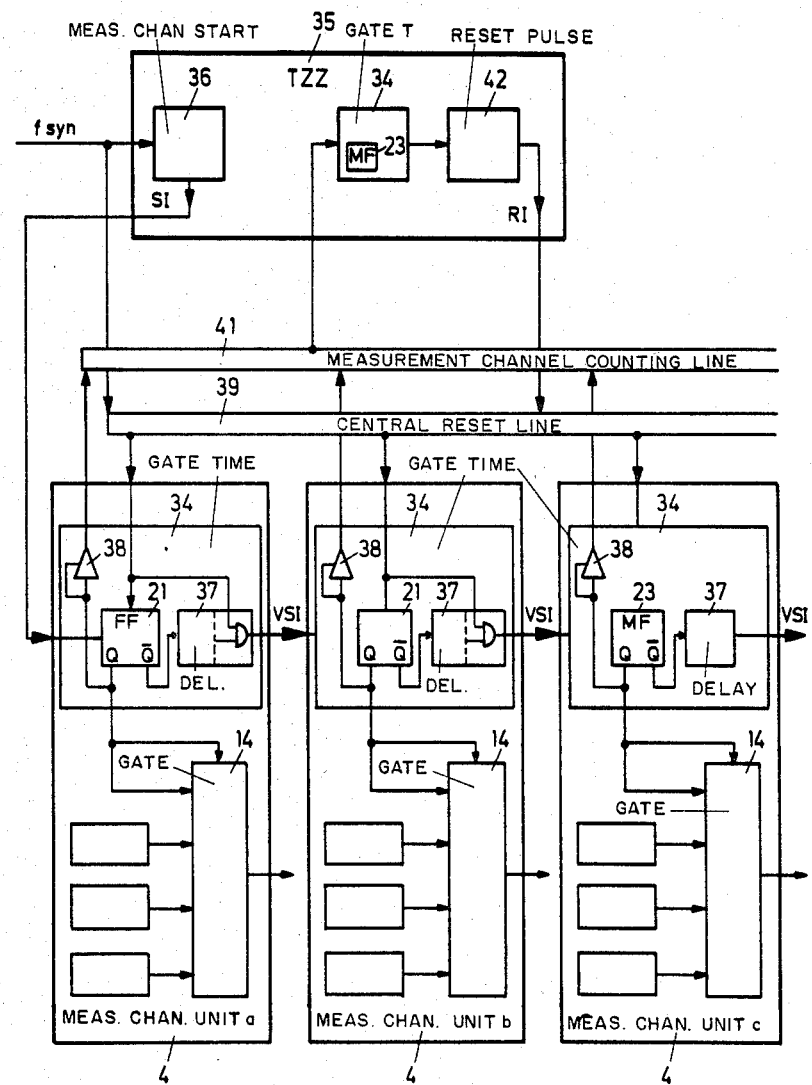

Further details, advantages and characteristics of the method and the apparatus according to the invention will be learned in the following description of the drawings, which illustrate examples of apparatus for performing the method and the individual switching circuits. Shown are:

FIG. 1, a block circuit diagram of the apparatus according to the invention;

FIG. 2, a measurement signal generating circuit;

FIG. 3, a screen display of a measurement value;

FIG. 4, a fundamental circuit for measurement signal generation;

FIG. 5, a pulse diagram for FIG. 4;

FIG. 5a, a screen display of a measurement value from bottom to top;

FIG. 5b, a screen display of a measurement value from top to bottom;

FIG. 6, a fundamental circuit diagram analogous to FIG. 4 for the horizontal display of measurement values;

FIG. 6a, a screen display of a measurement value from right to left;

FIG. 6b, a screen display of a measurement value from left to right;

FIG. 7, a fundamental circuit diagram of the measurement channel having a threshold value transducer;

FIG. 8, a measurement value circuit having a bistable multivibrator circuit;

FIG. 9, a measurement value circuit having a monostable multivibrator circuit;

FIG. 10, a threshold value transducer circuit having an adjustable monostable multivibrator;

FIG. 11, a measurement channel according to FIG. 7 having a common time-base generator;

FIGS. 12–18, exemplary embodiments for generating the measurement signal and/or the threshold value signal;

FIG. 19, a measurement channel having a threshold value marker transducer;

FIG. 19a, a selection circuit having coordination of measurement value and threshold values and colors;

FIG. 20, a measurement channel having a threshold value marker transducer and threshold value memory;

FIG. 21, a measurement channel having a gate time circuit;

FIG. 22, two measurement channels having a data bus and a control bus;

FIG. 23, measurement channels having a central gate time station; and

FIG. 24, a block circuit diagram corresponding to FIG. 1 but with additional switching circuits.

In FIG. 1, a block circuit diagram of an apparatus for displaying one or more measurement values of arbitrary measurement variables on the screen of a video display terminal (VDT) operating on the line-scanning principle is shown in schematic form. An apparatus of this kind substantially comprises a base unit GE 1 having a synchronizing pulse station 2, which in a manner known per se emits line- or frame-synchronizing pulses fsynH or fsynV, respectively. The base unit 1 further contains a selection circuit 7, the function of which will be described in detail later. Connected to this selection circuit 7 is a video level adaptor circuit 8, from whence a video signal is connected to a synchronizing mixing circuit 9, to which the corresponding synchronizing pulses are directed from the central pulse station 2. The signals are then prepared, forming a standardized RGB signal, in an RGB video signal circuit 10. A time-base generator 3 may also be disposed in the base unit GE 1, and its function will likewise be discussed in detail later. The base unit is connected with individual measurement channels 4 via a control bus 5 and a data bus 6. In an exemplary embodiment, up to fifty channels can be connected to the base unit. A scale distribution on the screen 16 is generated in a scaling circuit 58 and will be explained later.

In FIG. 2, a measurement signal generating circuit is shown, which is supplied with a measurement value in the form of a measurement voltage Ux and emits a measurement value MW to the bus 6. The measurement signal generating circuit has a measurement voltage amplifier 11, in which an analog measurement voltage Ux is converted to a standardized variable, for instance $100\% \leq 1$ volt. The standardized measurement voltage Ux is then directed to an input of an adding amplifier 12. A highly linear sawtooth voltage Us is generated by the time-base generator 3, which is controlled by a frame-frequency pulse fsynV, and delivered to the second input of the adding amplifier 12. The time-base generator 3 may be operated by the bootstrap method or by the Miller integrator method, for example. The sawtooth voltage Us is synchronized by a frequency corresponding to the frame-frequency pulses or else directly by the frame-frequency pulses fsynV of a video display terminal operating by the line-scanning process. The base time of the sawtooth voltage Us thus corresponds to the period time of the frame repetition rate of the VDT and of the line scanning frequency fsynH, which is multiply contained in the frame pulse frequency and is synchronized therewith as much as possible.

The output of the adding amplifier 12 is carried to a threshold switch 13, for instance a Schmitt trigger, which switches through if the sum of the sawtooth voltage Us and the measurement voltage Ux exceeds a predetermined threshold value Ust. The measurement voltage Ux is thereby converted into a time-proportional signal tx having steeply inclined edges. If an adding amplifier 12 having very great amplification is used, the threshold switch 13 could possibly be omitted and the signal tx picked up directly at the output of the amplifier 12.

The sawtooth voltage Us must also be standardized appropriately, as must the threshold value Ust of the threshold switch 13. Accordingly, $Ux_{maximum} = Us_{maximum} = Ust_{constant}$, corresponding to 100% of tx.

The corresponding coordination of the voltages and signals is shown in the lower portion of FIG. 2. In the illustrated example, the measurement voltage Ux is approximately 25% of the range of measurement voltage variation. Thus the edge of the sawtooth voltage Us is elevated above the threshold value Ust for a time tx amounting to 25% of the duration of a synchronizing pulse fsynV, so that during the time tx 25%, the screen is bright-scanned at an associated point.

The time signal tx thus created, which is proportional to the measurement voltage Ux, is gated in a subsequent AND circuit (gate circuit) 14 with a frequency corresponding to the line frequency or with the line frequency fsynH of the VDT operating on the line-scanning principle and thus forms the measurement value range which later becomes visible on the VDT. The signal which is present at the output of the AND circuit (gate circuit) 14, after being adapted in terms of its level, becomes the Y signal in the RBG video signal circuit 10.

In FIG. 3, a video display terminal (VDT) 15 having a screen 16 is shown. A measurement value range MWB and a signal range SB are shown on the screen 16. The signal range SB corresponds to the time signal tx, which was formed from the sum of the measurement voltage Ux and the sawtooth voltage Us.

If as described above the time-base generator 3 is synchronized with the frame-frequency pulse fsynV (or the line-frequency pulse fsynH) or some other appropriate frequency and has an ascending sawtooth course, the image reproduction corresponding to the measurement value is effected such that it rises horizontally on the screen 16, since as explained above, the sum of the measurement voltage Ux and the sawtooth voltage Us, the time tx, is continuously compared with the progressive course over time of the ongoing line frequency fsynH. The measurement value range which extends vertically is thereby displayed on the screen. The measurement value display is effected from bottom to top.

FIG. 4 shows a fundamental circuit having individual switching circuits of FIG. 1 for measurement signal generation. As explained above, a measurement voltage Ux is supplied to the measurement value adaptor circuit 11, 17 having the measurement voltage amplifier 11. The time-base generator 3 is controlled by the synchronizing pulse station 2 in the described manner. The signal generated in the summing amplifier 12 is carried in the described manner to the threshold switch 13 and, via a gate circuit 14, to the video signal adaptor circuit 8. In the following synchronizing pulse circuit 9, a BAS signal or a video signal is generated and passed on to the VDT.

FIG. 5 shows a pulse diagram for the fundamental circuit of FIG. 4. In the left-hand portion of FIG. 5, the sawtooth voltage is shown with an ascending edge; in the right-hand portion, it is shown with a descending edge. FIG. 5a corresponds substantially to FIG. 3 and shows the display of the measurement value range MWB or the signal range SB on the screen 16 of a VDT 15 with an ascending sawtooth voltage, while FIG. 5b analogously shows the conditions existing on the screen 16 in the case of a descending sawtooth voltage edge as shown in the right-hand portion of FIG. 5. If as described above the time-base generator 3 is synchronized with the frame-frequency pulses fsynV or a frequency corresponding to the frame-frequency pulses fsynV when the sawtooth course is descending, the image reproduction corresponding to the measurement value is effected such that it descends horizontally on the screen, since the time tx first appears, because of the course over time of the continuous line frequency fsynH, with the onset of the first line.

If the time tx is inverted via an inverter circuit, in the simplest case a NAND gate, then the reversals described above, dictated by an ascending or descending sawtooth edge in the time-base generator 3, can be reversed yet again. Thus the display of the measurement values can be effected on the screen 16 in all axial directions, in a simple manner.

In FIG. 6, a fundamental circuit diagram, analogous to FIG. 4, is shown for the horizontal display of measurement values on the screen 16.

If the time-base generator 3 is synchronized with the horizontal frequency fsynH and has an ascending sawtooth course, and the resultant sawtooth voltage Us is added to the measurement voltage Ux (after standardization of the measurement voltage in the amplifier V1 11) in the adding amplifier 12, the time tx, which has a course proportional to the measurement voltage, is the result, as already noted. If this time tx is supplied to an amplifier in a video level adaptor circuit 8 for Y-signal adaptation and mixed in a following synchronizing pulse circuit 9 with the horizontal and vertical pulse, then a standardized BAS signal of video frequency is available at the output of this mixing circuit 9. The display of the measurement voltage Ux, which has been converted and corresponds to the time tx, on a screen 16 is effected within the time period of one line; in the case of the ascending sawtooth, the display begins at the end of the lines, as shown in FIG. 6a, while in the case of the descending sawtooth, the display begins at the beginning of the lines, as shown in FIG. 6b.

In FIG. 7, a fundamental circuit diagram of a measurement channel having a threshold value transducer 18 is shown. The generation of a time signal tGW corresponding to the threshold value is effected in the threshold value transducer 18 in a manner analogous to the generation of the measurement signal tx. One threshold value transducer 18 is used for each threshold value; in place of the measurement voltage Ux, a known voltage Ug which is variable by means of an adjusting potentiometer 19, by way of example, is applied to the input of an amplifier 11.

The level of the voltage corresponds to the time and to the required threshold value. In a selection circuit 7 to be described later, the threshold value GW is compared with the measurement value MW, or the time tGW is compared with the measurement value time tMW. Should two threshold values be desired, two threshold transducers 18′, 18″ are used. The generated threshold value times tGW 1 and tGW 2 are compared in the selection circuit 7. The gate circuit 14 already mentioned is disposed prior to the selection circuit 7 and with this gate circuit 14 the selection is made as to when a measurement value tMW is allowed to pass through. The gate circuit 14 may be made up of suitably connected AND gates 20, by way of example. The gate circuit is switched in common with the frequency fsynH, so that every measurement value output or threshold value output passes the gate circuit simultaneously. The measurement value transducer 28 corresponds to the measurement signal generating circuit of FIG. 2.

In accordance with a modification of the circuit of FIG. 7, a single, common time-base generator 3 can be used for the measurement-value and threshold-value conversion, this generator supplying all the measurement value transducers and threshold value transducers 28 and 18′, 18″, respectively, with a sawtooth voltage. This time-base generator SG is synchronized in the described manner by means of a frame-synchronizing pulse fsynV or a line-synchronizing pulse fsynH. For decoupling or adaptation purposes, a decoupling amplifier 25 may be provided in the measurement value transducers 18 or threshold value transducers 18′, 18″. This decoupling amplifier may be embodied as an operational amplifier, so that by means of inverse coupling, for instance, a change in linearity of the sawtooth signal Us and thus a desired adaptation of linearity to the measurement voltage Ux can easily be accomplished.

In the above-described circuits, stairstep voltage generators may be used in place of the time-base generators. The synchronization is effected in the same manner as with the described time-base generators. If a stairstep voltage generator 26, which is acknowledged as known, is used, then the number of stairsteps produces a switching point sequence which is related to the resolution of the measurement value voltage Ux.

In a modification, the threshold value times tGW or the measurement value time tMW can also be generated by means of monostable multivibrator circuits (monostable multivibrator 23); as a result, these multivibrator circuits are started by the synchronizing pulses fsynV (or fsynH) and take their course for a period tx, which is determined exclusively by the resistance and capacitance of the timing element.

In generating the times tx by means of a monostable multivibrator, the following general condition applies: The maximum time which is determined by resistance and capacitance must have elapsed precisely at the time the next starting or synchronizing pulse fsynV (or fsynH) starts. This time corresponds, for instance, to 0% of the measurement value time tx. The minimum time which is determined by the time constant RC corresponds to 100% of the tx time. The range of variation between 0% and 100% of the measurement value time tx forms the signal range SB. The signal range SB is picked up at the Q output of the monostable multivibrator, for example, as time tx. If the $\overline{Q}$ output (that is, the negated output) of the monostable multivibrator is used for picking up the time tx, then the corresponding negation of the extreme values of the range, 0% and 100%, is effected.

By varying the resistance R, embodied by way of example as a potentiometer, corresponding threshold values GW can be formed. The output time, as described above, is designated tGW. If the monostable multivibrator resistor is embodied as a measuring resistor which is varied by means of the mechanical variation of a measurement variable, such as a travel distance, the result at the output is the time tx proportional to the measurement variable. Since in this case the monostable multivibrator serves as a measurement value transducer, the time tx is equal to a measurement value time tMW. The above described general condition is necessary in order to form a measurement value range MWB or a signal range SB extending from 0 to 100%.

With the above described monostable multivibrator circuit, a constant-current source 22 may be provided in place of the variable resistor. It is then possible to control the constant-current source 22 by means of the measurement value voltage Ux, or to vary its internal resistance accordingly. As a result, analogously to the measurement value, the output time tx of the monostable multivibrator which elapses once and corresponds to the measurement value time tMW varies, until the appearance of the next starting pulse. The following general conditions apply here: The maximum time which is determined, varied corresponding to Ux, by the constant-current source 22 must, at the latest, have elapsed completely when the next monostable multivibrator starting pulse fsynV (or fsynH) arrives. The maximum time corresponds to 100% of tx, and the minimum time corresponds to 0% of tx, when the Q output of the monostable multivibrator is used. If the monostable multivibrator is used as a measurement value transducer, for example, the output time tx applies as the measurement value time tMW. However, the monostable multivibrator can also be used as a threshold value transducer, in which case the output time tx applies as the threshold value time tGW. An apparatus of this kind is shown in FIG. 9. The measurement voltage Ux is delivered to a constant-current source 22, from whence a capacitor C 24 is charged. A monostable multivibrator 23 is started by the frame-synchronizing pulse fsynV (or the line-synchronizing pulse fsynH).

A further embodiment provides that the measurement value times tx and threshold value times tGW are generated in the measurement value transducer or threshold value transducer by means of monostable multivibrator circuits. Again, the monostable multivibrator circuit (monostable multivibrator 23) is started by the synchronizing pulses having the frequency fsynV (or fsynH) and runs for the period of time which is determined exclusively by R and C. This apparatus is shown in FIG. 10. The resistor R 19 is shown here is an adjustable potentiometer.

A further possible means of converting a measurement value Ux into a corresponding time tx is to charge a capacitor 24 via a constant-current source 22, the capacitor 24 then being discharged by a transistor Tr with the synchronizing pulse fsynV (or fsynH). At the same time, a flip-flop 21 is set, the output Q at first being set at "low". As a result of the increasing charge voltage at the capacitor C 24, the flip-flop is set, when a predetermined threshold voltage Ust is attained, such that its output Q becomes "high". The constant-current source 22 is controlled by a measurement voltage Ux in such a manner that its internal resistance, and accordingly the dependency of the current flow on the measurement voltage Ux, is varied. The range of variation, or the corresponding measurement range, is dimensioned such that at Ux=0, for instance, the lowest possible charge current flows into the capacitor C 24, and the attainment of the threshold voltage Ust simultaneously occurs with the onset of the next synchronizing pulse fsynV (or fsynH); at Ux=100%, the largest possible charge current flows into the capacitor C, as a result of which the threshold voltage Ust is already attained a short time after the arrival of the synchronizing pulse. The two attainable states define the measurement range from 0 to 100%. At the output Q of the flip-flop 21, the duration of the "high" level corresponds to the time tx or the measurement value time tMW. By using the Q output of the flip-flop as a measurement signal tx, the extreme range values 0% and 100% on the display axis reverse themselves, as described above.

As described in connection with FIG. 8, a measurement value can also be formed by setting a flip-flop 21 with the synchronizing pulse fsynV (or fsynH) and resetting it with the time tx, which as described above is formed from the sum of Us+Ux. Since the setting of the flip-flop is effected simultaneously with the start of the time-base generator, and its resetting is effected simultaneously with the time tx, the time appearing at the output of the flip-flop 21 also corresponds to the time tx. This apparatus offers the following advantages: If after the flip-flop 21 has been reset, brief voltage interruptions in the measurement voltage Ux occur, they are not taken into consideration until the next setting of the flip-flop 21 and thus do not cause any interference within the period tx. A further advantage is that steeply inclined switching edges are generated. The flip-flop 21 can also be set with the time tx and reset with the synchronizing pulse. The extreme range values 0% and 100% then reverse themselves, as already described above.

Figure 12:
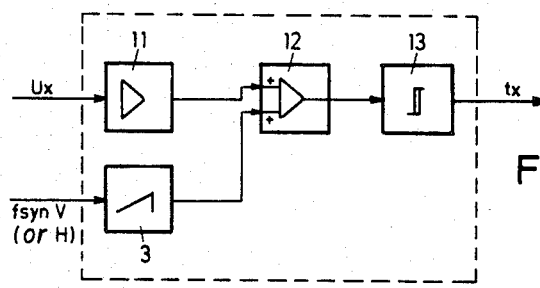
Figure 13:
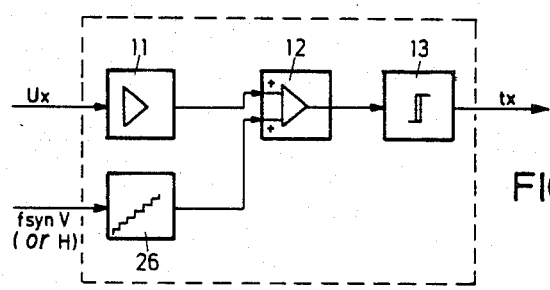

In FIGS. 12-18, schematic switching circuits are shown which illustrate the various possibilities for time formation tx for use as measurement value transducers or threshold value transducers. FIG. 12 corresponds substantially to FIG. 2; FIG. 13 shows a modification in which a stairstep voltage generator 26 is used in place of the time-base generator 3.

Figure 14:
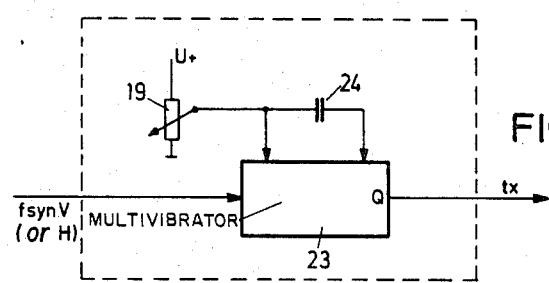

In FIG. 14, an apparatus is shown in which a fixed voltage U+, possibly variable by means of a potentiometer resistor 19, is supplied to a monostable multivibrator 23 in order to form a threshold value.

Figure 15:
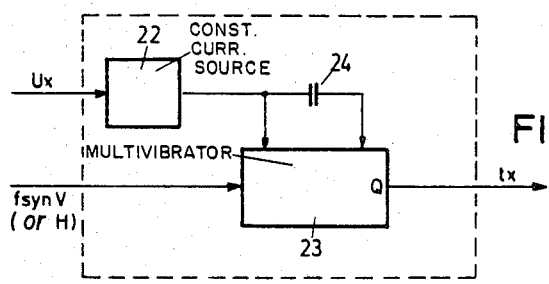

FIG. 15, in schematic form, shows the generation of a measurement value time tx from a measurement voltage Ux with the aid of a constant-current source, which is variable by UX, and of a monostable multivibrator 23 and a capacitance 24.

Figure 16:
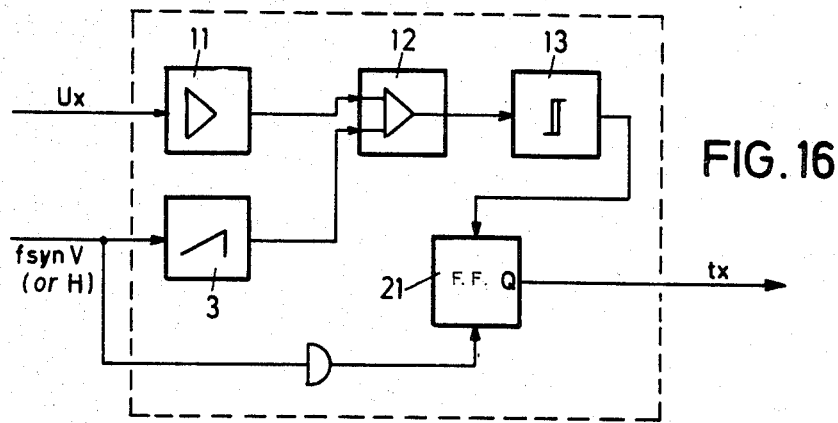
Figure 17:
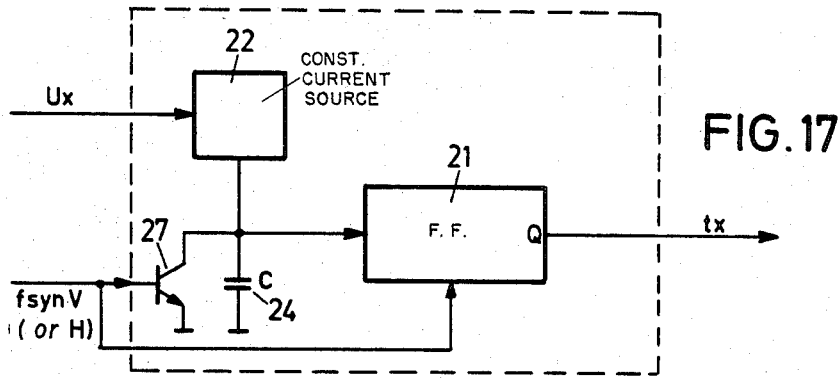

FIG. 16 illustrates the use of a flip-flop 21 supplied by a constant-current source 22 and set in accordance with fsynV or fsynH via a transistor 27.

Figure 18:
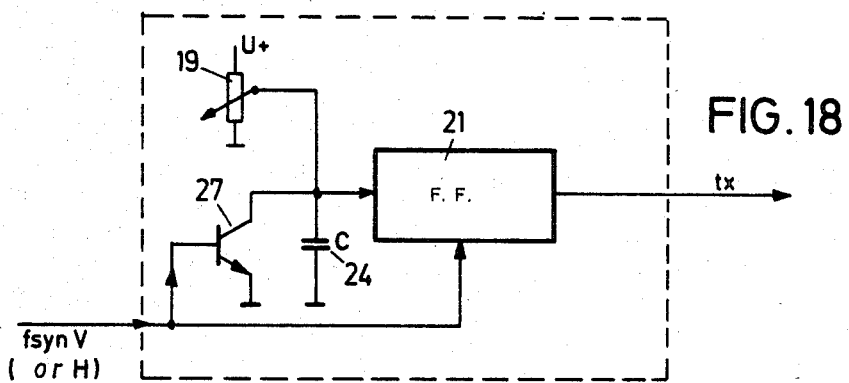

In analogous fashion, FIG. 18 shows the generation of a threshold value voltage or measurement value voltage with the aid of a constant voltage U+, which is varied by means of a measuring potentiometer 19 and supplied to a flip-flop 21, which is simultaneously supplied via a transistor 27 with a synchronizing pulse fsynV or fsynH.

In order to indicate on the screen 16 where a threshold value was set, and in the event that at that instant the measurement voltage Ux is absent, a threshold value marker must be displayed. To this end, in accordance with a further embodiment of the apparatus described above, a threshold value marker transducer GWM 31' or 31" is provided, which may by way of example be a monostable multivibrator 23. This monostable multivibrator, at the onset or after the elapse, is started with the threshold value time tGW, and it generates a threshold value marker of the particular duration desired. This threshold value marker time is supplied to the measurement value output tMW. The threshold value marker time, designated tGWM, is simultaneously supplied to the measurement value output tMW. In order to avoid malfunctioning in the logic circuit, an OR gate 30 is efficaciously provided at the threshold value marker signal output tGWM and the measurement value output tMW; the OR gate may be made up of diodes D1, D2 and D3, by way of example.

In case a plurality of threshold value marker transducers GWM is provided in one measurement channel, all the threshold value maker times tGWM formed by them are linked in common with the measurement value time tMW via the OR gate or diode gate 30 and delivered in common to the measurement value input of the gate circuit 14. FIGS. 19, 20, 21, 22 show an apparatus of this kind. The threshold value marker time tGWM may efficaciously be formed with a flip-flop 21 in the threshold value marker transducer 31. This flip-flop is set with the threshold value time tGW, for instance, and reset with the synchronizing pulse fsynH, for instance. In FIG. 19, a threshold value marker transducer 31' is shown with a flip-flop 21 and a threshold value marker transducer 31" is shown with a monostable multivibrator 23.

The threshold value times are delivered to the selection circuit 7 after passing through the gate circuit 14. The selection circuit 7 is required in order to display on the screen by what value or amount a set threshold value has been exceeded by the measurement voltage Ux, or what value of amount of the measurement voltage Us is still lacking in order to attain a set threshold value GW. One simple example of a selection circuit for a threshold value GW and a measurement value MW is shown in FIG. 19a. In this example, two NAND gates are provided as well as two inverters I 1 and I 2. The time tMW is supplied to both NAND gates, and the output of the NAND gate 2 is supplied to the input of the NAND gate 1. As a result, it is assured that only when time tMW is present can a "high" level be present at the output of the inverter I 1 or I 2. If only the time tMW is present, I 1 will have a "high" level. If the times tMW and tGW are present, the inverter I 2 will have a "high" level. If no measurement value time tMW is present, and only the threshold value time tGW is present, then both I 1 and I 2 will have a "low" level. In the event that a threshold value is set and at the same time no measurement value time tMW is present, then because of its marker time tGWM, which is added to the time tMW and the time tGW, this threshold value will effect a "high" level at the output of the inverter 2 for the duration of the threshold value marker transducer time tGWM.

In a still further embodiment, it is possible to store in memory occasions where the set threshold values are exceeded by the measurement voltage Ux. The storage is effected in so-called threshold value memories 32' and 32", for instance by means of setting a flip-flop. The comparison of the threshold value time tGW with the measurement value time tMW determines when the flip-flop is set. If a threshold value and a measurement value are present, and if the measurement value attains or exceeds the set threshold value, the flip-flop of the threshold value memory is set. The information that the threshold value was exceeded by the measurement value remains stored in the flip-flop until such time as the flip-flop is reset. This resetting may be effected either by hand, by actuating a threshold value memory reset switch 32, or by means of a pulse-controlled threshold value memory reset switch, as shown in FIG. 20. The outputs of the threshold value memories may trigger a luminous display or a relay, for instance, or may be carried to a data bus 6 which will be described later.

A corresponding circuit is shown in FIG. 20.

In order to indicate the value assumed by a measurement value on the screen 16, a scaling circuit 58 is provided. The generation of scale lines can be performed by circuits known per se. In the scaling circuit 58, both fixed and variable lines can be generated, displayed both horizontally and vertically on the screen 16, using the principles of threshold value marker time formation tGWM described above. The generated lines may be supplied via the video level adaptor 8 to the video signal in a freely determinable color channel. As a result, the scale lines can be displayed in color. A scaling circuit 58 is shown in FIGS. 1 and 24.

The description thus far has made the assumption that for displaying the measurement values or threshold values or threshold markers on the screen 16 of a video display terminal 15, the entire field of the screen was available for use. However, it was already noted in describing individual drawing figures that a plurality of measurement channel units 4 may be provided, in order to display a plurality of measurement variables on the screen. In order to make the individual measurement variables clearly distinguishable from one another on the screen, a further embodiment efficaciously provides that the full line or frame duration not be used for displaying the times tGMW and tGW. To this end, a gate time circuit 34 is provided, so that the existing time signals of the measurement value tMW and, if present, the threshold values tGW are simultaneously switched through only for a predetermined time period. This time period will now be designated as tTZ and is formed in the gate time circuit 34. This gate time circuit 34 substantially comprises a monostable multivibrator 23, which for instance is started with the line-frequency pulse fsynH. Its transit time corresponds with the gate time tTZ. The gate time, however, should not be longer than the duration of one line. As a result, it is possible to utilize a particular region on the screen 16 for displaying the measurement values and/or threshold values, or by using a plurality of gate time circuits (for example, one gate time circuit 34 for each measurement channel 4) to display a plurality of measurement values in common on the screen 16. To this end, as shown in FIG. 21, which substantially shows one measurement channel unit 4, one gate time circuit 34 is provided in each measurement channel unit 4; with the gate time pulse tTZ, the gate time circuit 34 acts upon the gate circuit 14, and the gate circuit 14 is efficaciously embodied with tristates 38 when a plurality of measurement channel units is used. For greater clarity of illustration, FIG. 22 shows two measurement channel units 4, MK4a and MK4b; the individual signal routes furnished to the data bus 6 are shown, as well as the individual control signal routes arriving from the control bus 5. The gate time tTZ is supplied to the data bus 6, and the threshold value memory is also turned on, like the threshold value transducers GW 1 and GW 2; the corresponding measurement value tMW is furthermore furnished to the data bus 6 via the gate circuit 14. Finally, a second threshold value memory GWS 2 and a second threshold value transducer GWG 2 can also be connected to the data bus 6. To this end, the gate circuit 14 is expanded accordingly in each measurement channel unit $MK4_i$, i=integer.

The control bus 5 receives its signals from the base unit 1 (not shown) and emits synchronizing signals fsynV or fsynH and the sawtooth voltage to the individual circuits of each measurement channel unit 4 in the manner described above.

States stored in the threshold memories GWS are carried via the gate circuit 14, and in the same manner the gate time tTZ formed by the gate time circuit 34 is passed on via the gate circuit 14. All the measurement values and threshold values, signals and data passed through by the gate circuit 14 are determined by the duration switched by the measurement channel unit 4, and are fed to the data bus 6 for this duration. The data bus 6 accumulates all the above described data of one measurement channel unit 4 simultaneously, or in other words parallel.

The gate time circuits 34 are embodied such that whenever the duration switched by a measurement channel unit MK4a has elapsed, the gate circuit 14 of this measurement channel unit is shut off, whereupon a starting pulse Si for switching on the next subsequent measurement channel unit MK4b is simultaneously emitted to this unit MK4b.

The selection unit 7 which is common to all the measurement channel units 4 is located in the base unit GE 1.

The selection circuit 7 has the function of preventing possible signals which may be present simultaneously at its inputs from arriving simultaneously at its outputs. To this end, the selection circuit specifies, by means of the logical linkage of the input signals comprising the times of measurement value time tMW and threshold value time tGW1 (and tGW2 if a second threshold value transducer is used), that only a specific input signal combination can appear as the output signal at an output of the selection circuit 7 associated with this combination. This association can be selected, by way of example, such that the threshold value time tGW1 is associated with the input 1 and the output designated as R, while the measurement value time tMW is associated with the input 2 and the output designated G; the second threshold value time tGW2 can be associated with the input 3 and the output B. A selection circuit having this kind of association is shown in FIG. 19. The outputs R, G and B correspond to the color channels of a color VDT 15, which because of the above described association displays the threshold value time tGW1 in RED, the measurement value time tMW in GREEN and the threshold value time tGW2 in BLUE. The selection circuit is based on the laws of Boolean algebra.

In accordance with a further embodiment of the measurement channel units 4 and the base unit 1, the gate time circuits 34 in the measurement channel units 4 are embodied with a flip-flop 21 and a delaying circuit 37 to be described later, as shown in FIG. 23 in the measurement channel units MK4a/b/c. The formation of the gate time tTZ is performed in this embodiment in a central gate time station 35, which is disposed in the base unit. Disposed in the central gate time station 35 are a measurement channel starting unit 36, a reset pulse circuit RiS 42 and a gate time circuit 34. This gate time circuit forms the gate time tTZ like the gate time circuits 34 in the measurement channel units described above, that is, with a monostable multivibrator 23. This monostable multivibrator now centrally forms the gate time tTZ for the measurement channel untis MK4, which have a flip-flop 21 disposed in their gate time circuits 34. The flip-flop 21 in the gate time circuit 34 in a measurement channel unit MK4 determines, for instance with its Q output, that the gate circuit 14 in the measurement channel unit MK4 in the Q case "low" is closed, for instance, and in the Q case "high" is opened. The Q output switches via the delaying circuit 37 to the next subsequent measurement channel unit and there effects the impetus for forming the next gate time tTZ. One advantage of this further embodiment is that the measurement channel units MK4 having the flip-flop 21 in the gate time circuits 34 all assume the same gate time tTZ. This gate time tTZ is centrally formed in the central gate time station 35 by means of the gate time circuit 34 disposed there and having the monostable multivibrator 23 located there.

The gate time tTZ for one or for many measurement channel units MK4, which is started by a synchronizing pulse such as fsynH in the first measurement channel unit MK4a, must be completed by the time of the arrival of the next synchronizing pulse at the first measurement channel unit.

At the onset of the gate time period of all measurement channel units, all the flip-flops 21 in the gate time circuits 34 of the measurement channel units MK4 are first set, via a central reset line 39 which is associated with the control bus 5 in the base unit, with the synchronizing pulse, for instance fsynH, to Q "low". After the reset process has run its course (the reset process is likewise derived from the synchronizing pulse), the measurement channel starting circuit 36 will form a first starting pulse, which is designated Si in FIG. 23, for example. This starting pulse Si is supplied only to the first measurement channel unit. With the starting pulse Si, only the flip-flop 21 of the gate time circuit 34 in the first measurement channel unit MK4a is set to Q "high". The gate circuit 14 is thereby simultaneously switched on (whereupon the data relating to the measurement values and threshold values are fed to the data bus 6), and again simultaneously with the setting of the flip-flop 21 to a Q "high" level, this level is carried, via a diode or a tristate 38 intended for this purpose in the measurement channel MK4, to a measurement channel counting line 41, which is associated with the control bus 5 in the base unit. The disposition of the tristate 38 in the gate time circuits 34 in the measurement channel units MK4 and the measurement channel counting line 41 as well as the central reset line 39 already described are all shown in FIG. 23.

The measurement channel counting line 41 will carry the above described Q "high" alternation of the first measurement channel unit MK4a to the central gate time station 35, in order there to form the gate time tTZ in the gate time circuit 34 in the monostable multivibrator 23. After this gate time circuit 34 has elapsed in the central gate time station 35, a reset pulse Ri is formed in the reset pulse circuit RiS 42. The reset pulse Ri is carried via the central reset line 39 to all the measurement channel units and there assures that only a flip-flop 21 set at Q "high" in the gate time circuits 34 of the measurement channel units MK4 is set to Q "low" level. As a result, the gate time tTZ of the first measurement channel unit MK4a is terminated, and a starting pulse is formed simultaneously and carried, characterized as a delayed starting pulse Vsi by means of a suitable delaying circuit 37, to the next subsequent measurement channel unit MK4b and there sets the gate time circuit to a "high" level, as a result of which the next gate time formation is initiated. Once the signal has passed through all the measurement channel units, the next synchronizing pulse at the first measurement channel unit begins the cycle once again.

If when a plurality of measurement channel units MK4 is used, a plurality of measurement values is displayed visually on the screen 16, then at first indefinite intervals between the measurement value displays on the screen become visible. These intervals are formed by time intervals, which arise during the switchover of the flip-flop 21 in the gate time circuits 34 in the measurement channel units MK4.

These time intervals and thus the spatial intervals are relatively short, and may also be of variable length from one measurement channel to another. If dynamic J-K flip-flops 21 are used in the gate time circuits 34 in the measurement channel units MK4, for example, the time of the reset pulse RiS must be shorter than the transit times in the flip-flops. In order to overcome these disadvantages, a further embodiment of the invention provides that a suitable delaying circuit is inserted between the measurement channel units. The delaying circuit 37 is efficaciously disposed in the gate time circuits in all the measurement channel units MK4, as shown in FIG. 23. The delaying circuit 37 delays the passing on of the starting pulses Si formed in the measurement channel units MK4 to the next subsequent measurement channel unit for a period of time which can be determined in the delaying circuit. The starting pulse delayed in the delaying circuit 37 is designated as VSi. If the delayed starting pulse VSi is delayed for the duration of 0.5 sec, for instance, and then passed on to the next subsequent measurement channel unit MK4b, the interval until the next subsequent measurement value image displayed on the screen 16 amounts to 0.5 sec.

The starting pulse VSi delayed in the delaying circuit 37 is efficaciously linked via an AND gate 20, which is disposed by way of example in the output of the delaying circuit 37, with the reset pulse Ri, as shown in FIG. 23 in the measurement channel units MK4a and MK4b. As a result, the delay time of the delayed starting pulse VSi for all the measurement channel units MK4 having a delaying circuit 37 and an AND gate 20 at the output of the delaying circuit 37 is definable with the reset pulse Ri.

If according to a further development of the measurement channel unit MK4 having a monostable multivibrator 23 in the gate time circuit 34, a tristate 38 is disposed, for instance at the Q output of the monostable multivibrator, such that the Q "high" output of the monostable multivibrator leads to the measurement channel counting line 41 and if a delaying circuit 37 for the starting pulse is introduced, then the measurement channel units 4 having a flip-flop 21 or a monostable multivibrator 23 in the gate time circuits 34 can be used in common in a base unit having a central gate time station 35. As a result, different and common gate times are possible for reproducing measurement values on the screen 16 in the form of bars; for instance, groups having measurement images in the form of bars of equal width are possible, as well as individual measurement images in the form of bars of varying widths.

A different arrangement of measurement channel units is shown in FIG. 23. The measurement channel units MK4a and MK4b have flip-flops 21 in the gate time circuits 34 and they form identical gate times tTZ with the central gate time station 35. The measurement channel unit MK4c forms the gate time tTZ in the monostable multivibrator 23 in its own gate time circuit 34. In the measurement channel units MK4a, MK4b, the delaying circuit 37 is linked with the AND gate 20 and the reset pulse Ri. In the measurement channel MK4c, the delaying circuit 37 is shown without any OR gate 20.

In FIG. 24, a complete apparatus is shown, where in addition to the described units in the base unit GE 1, a power supply unit 50 is also provided for the central supply of current. The control bus 5 and the data bus 6 may likewise be integrated into the base unit GE 1. The individual measurement channel units MKi (for instance, individual units 1 . . . 50) can be connected to this control bus 5 and data bus 6; the measurement channel units MK4 may be designed as mechanically separate modules and such that they can be plugged into the base unit GE. Also provided inthe base unit 1 are the video level adaptor 8, the synchronizing pulse mixing circuit 9 and the video signal circuit 10 which have already been described. A scaling circuit 58 may additionally be provided, which generates fixed and displaceable scale lines on the screen, for instance by the same principle as described for forming the threshold value markers. A character generator 55 may also be provided, and a measurement channel recognition circuit 53 connected with a measurement channel numerical counter 54. The character generator 55 is connected via a BCD (binary coded decimal) converter 56 with a level measuring circuit 59 for displaying the measurement values in numerical characters on the screen. A time/date unit 57 may also be connected to the apparatus. In order to generate the reset pulse for the individual threshold value memories, an automatic threshold value reset circuit 52 is provided, which emits its pulses to the threshold value memory in the measurement channel units. A reset switch 44 which is actuatable by hand is efficaciously provided.

The required fundamental frequency for the synchronizing pulse station 2 is generated in an oscillator 43. The required pulses as well as the sawtooth voltage Us are generated in the central synchronizing pulse station. The starting pulses Si or the delayed starting pulses VSi among the measurement channel units MK 1 . . . 50 are carried on to the next subsequent measurement channel unit in accordance with the given type of measurement channel unit.

Finally, it is also advantageous if a data interface 60 is provided, in order to provide a connection with a data processing unit (not shown).

When a video display terminal equipped in accordance with the NTSC, PAL or SECAM process is used, by way of example, the video signal can be picked up in the video signal circuit 10 at a standardized voltage of 1 VSS to 75 ohm, after an appropriate standardizing conversion. However, it is also possible to provide a high-frequency circuit 51, which emits a high-frequency signal which can be furnished to the antenna bushing of a corresponding monitor or color television set.

In a manner known per se, a chrominicity (hue) determination circuit 46 and a chrominicity (saturation) determination circuit 47 are also provided, as well as a final color stage 48 and a color and video mixing circuit 49. These last four circuits are designed in accordance with known technology and require no further explanation.

The invention is not restricted to the exemplary embodiments, apparatus and combinations of switching circuits described herein. It also encompasses modifications and further developments within the competence of one skilled in the art, as well as partial combinations and subcombinations of the characteristics and provisions described and/or shown herein.

I claim:

1. A method for displaying one or more measurement values of arbitrary measurement variables on the screen of a video display terminal (VDT) operating by the line-scanning process, in particular a color VDT, in which line-frequency pulses and frame-frequency pulses are generated in a synchronizing pulse generator, the method comprising:

generating a measurement voltage (Ux) corresponding to a measurement variable;

standardizing said measurement voltage in a measurement voltage amplifier;

simultaneously supplying said standardized measurement voltage and a sawtooth voltage to an adding amplifier;

synchronizing the sawtooth voltage (Us) by the frame-frequency or line-frequency pulses;

supplying the output voltage of the adding amplifier to a threshold switch;

causing said switch to emit a time-proportional signal if the threshold value is exceeded by the summed voltage;

sending the resulting signal proportional to the measurement voltage to a subsequent gate circuit synchronized with the line-frequency or frame-frequency pulses; and sending said proportional signal, after level adaptation and synchronizing pulse mixing, to the VDT as a video signal.

2. A method as defined by claim 1, wherein the sawtooth voltage (Us) has an ascending edge, further comprising synchronizing said sawtooth voltage with the frame-frequency pulses or a frequency corresponding to the frame-frequency pulses, in such a manner that the reproduction of the measurement value on the screen of the VDT takes place increasingly from bottom to top.

3. A method as defined by claim 1, wherein the sawtooth voltage (Us) has a descending edge, and further comprising synchronizing said sawtooth voltage with the frame-frequency pulses or a frequency corresponding to the frame-frequency pulses, in such a manner that the reproduction of the measurement voaue on the screen of the VDT takes place from top to bottom.

4. A method as defined by claim 1, wherein the sawtooth voltage (Us) has an ascending edge, and further comprising synchronizing said sawtooth voltage with the line-frequency pulse or a frequency corresponding to the line-frequency pulses, in such a manner that the reproduction of the measurement value on the screen of the VDT takes place increasingly from right to left.

5. A method as defined by claim 1, wherein the sawtooth voltage (Us) has a descending edge, and further comprising synchronizing said sawtooth voltage with the line-frequency pulses or a frequency corresponding to the line-frequency pulses, in such a manner that the reproduction of the measurement value on the screen of the VDT takes place increasingly from left to right.

6. A method as defined by claim 1, and further comprising supplying the gate circuit with a threshold value signal, sending said threshold value signal by means of the supply of an adjustable fixed voltage (Ug) to an adding amplifier, supplying a sawtooth voltage (Us) to said adding amplifier, said sawtooth voltage being synchronized by the frame-synchronizing pulse or line-synchronizing pulse and generating a signal, in a manner analogous to the measurement signal generation by a threshold switch, which is time proportional to the threshold value.

7. A method as defined by claim 6, and further comprising forming said sawtooth voltage (Us) for the formation of the measurement value signal (tx) and the formation of the threshold value by a common time-base generator.

8. A method as defined by claim 6 or 7, and further comprising generating a time-proportional threshold value marker signal in order to reproduce a threshold value marker on the screen of the VDT is the measurement voltage is absent or is smaller than the threshold value, and supplying said threshold value marker signal to the measurement value signal and to the gate circuit.

9. A method as defined by claim 8, and further comprising activating a threshold value memory if a predetermined threshold value is exceeded by the measurement signal.

10. A method as defined by claim 9, and further comprising erasing the threshold value memory, selectively or automatically, by a reset pulse.

11. A method as defined by claim 1, and further comprising providing a selection circuit including R, G and B outputs associated with the color channels of a color VDT, and outputs corresponding to the threshold value or measurement value, delivering the pulses passing through the gate circuit to said selection circuit when a color video display terminal is used, causing said selection circuit to emit output signals in accordance with the magnitude of the threshold value and/or of the measurement value, and sending the RGB signals to the VDT directly or in converted form, via a high-frequency circuit, as a standardized high-frequency color signal.

12. A method as defined by claim 1, and further comprising associating one measurement channel with each measurement value, and one gate circuit with said measurement channel whereby a plurality of threshold values and/or measurement values can be displayed simultaneously supplying the gate circuit of a first measurement channel with a gate time pulse which is synchronous with the frame or time and is formed in a gate time circuit by means of a monostable and/or a bistable multivibrator, and supplying the gate time pulses associated with the individual measurement signals (txi) in sequence over time to the next subsequent gate time circuit of the next measurement channel.

13. A method as defined by claim 12, further comprising providing that the total time of one or of all the gate time pulses is equal to or less than the time of a line on the screen of the VDT.

14. A method as defined by claim 12, further comprising providing that the total time of one or of all the gate time pulses is equal to or less than the time of a frame on the VDT.

15. An apparatus for displaying one or more measurement values of arbitrary measurement variables on the screen of a video display terminal (VDT) operating on the line-scanning principle, in particular a color VDT, in which line-frequency and frame-frequency pulses are generated in a synchronizing pulse generator, having a power supply unit and a synchronizing pulse generator, comprising a base unit containing the synchronizing pulse generator, a video level adaptor circuit and a synchronizing mixing circuit, and further comprising at least one measurement channel unit, including a measurement voltage amplifier for standardizing a measurement voltage (Ux), an adding amplifier to which is supplied the measurement voltage (Ux) and a sawtooth voltage (Us) generated by a time-base generator, a threshold switch to which the summed voltage of the adding amplifier is supplied, and a gate circuit synchronized with the line frequency or frame-frequency pulse (fsynH, fsynV), an output signal (tx) of the threshold switch and the gate circuit furnishing a measurement value signal (tx) proportional to the measurement value to the video signal output circuit, on the basis of which measurement value signal (tx) a video signal is formed in the synchronizing pulse mixing circuit.

16. An apparatus as defined by claim 15, wherein the gate circuit is an AND gate, a NAND gate or a tristate circuit.

17. An apparatus as defined by claim 15 or 16, and further comprising a threshold value transducer, to which a threshold value voltage (Ug) is supplied from an adjustable fixed-voltage source via a first amplifier, an adding amplifier for forming a summed voltage of the threshold value voltage and a sawtooth voltage (Us) generated by a time-base generator, and a threshold switch the output of which is connected with the gate circuit following the adding amplifier.

18. An apparatus as defined by claim 15, wherein at least one threshold value transducer is provided in each measurement channel unit.

19. An apparatus as defined by claim 15, and further comprising a flip-flop circuit, which is set by a synchronizing pulse and is reset after the elapse of the time (tx), for the generation of a measurement signal which is proportional to the measurement value but in the set state is independent of the measurement voltage.

20. An apparatus as defined by one of the claims 15–18, and further comprising a monostable multivibrator circuit started by synchronizing pulses (fsynV or fsynH), the time-determining resistor (R) of the RC member being a constant-current source controlled by the measurement voltage (Ux).

21. An apparatus as defined by claim 20, wherein for generating a measurement signal (tx) and a threshold value signal (tGW), the resistor of the RC member of the monostable multivibrator is embodied as a potentiometer which is adjustable arbitrarily or by the measurement value.

22. An apparatus as defined by claim 15, wherein a common time-base generator is associated with all the threshold value transducers and all the measurement value transducers, and a decoupling amplifier is provided in each threshold value transducer circuit and each measurement value transducer circuit and serves as an operational amplifier for linearizing the measurement value (tx).

23. An apparatus as defined by claim 15, wherein the time-base generator is embodied as a stairstep generator.

24. An apparatus as defined by claim 15, wherein in each measurement channel having a threshold value transducer, a threshold value marker transducer is coupled with the threshold value transducer and the gate circuit, and in order to prevent malfunctioning an OR gate or diode gate is provided in the following circuit.

25. An apparatus as defined by claim 15, and further comprising a selection circuit following the gate circuit or circuits and having NAND gates and inverter circuits.

26. An apparatus as defined by claim 18, and further comprising threshold value memories associated with each threshold value transducer.

27. An apparatus as defined by claim 26, wherein the threshold value memories comprise flip-flop circuits which are set upon the attainment or exceeding of the threshold value by the measurement value and are individually reset selectively by hand or in a pulse-controlled manner.

28. An apparatus as defined by claim 15, and further comprising a gate time circuit for the time limitation of the display of the measurement value and the threshold values on the screen of a video display terminal connected to a time which is a portion of the course of one line, the gate time circuit having a monostable multivibrator started by the line pulse (fsynH), the transit time of the monostable multivibrator being less than or equal to the duration of the line.

29. An apparatus as defined by claim 15, wherein for the common display of a plurality of measurement values on the screen of the VDT, one measurement channel unit is provided for each measurement value, each measurement channel unit having a gate time circuit which controls the respective gate circuit and after a predetermined gate time has elapsed emits a starting pulse (si) for the next subsequent measurement channel unit.

30. An apparatus as defined by claim 28 or 29, wherein the gate time circuit of a first measurement channel is started by a central gate time station and after its gate time has elapsed emits a starting pulse (si) to the gate time circuit of the next subsequent measurement channel and to the central gate time station.

31. An apparatus as defined by claim 15, wherein the base unit and the measurement channel units are connected via a data bus to which the measurement values, threshold values, threshold value pulses and the like are supplied by the measurement channel units and are carried by them to the base unit, said base unit and said measurement channel units further being connected via a control bus to which the synchronizing pulses (fsynH, fsynV), the sawtooth voltage (Us) as applicable and the gate time pulses are supplied by the base unit for emission to the measurement channels.

32. An apparatus as defined by claim 31, wherein when a color video display terminal is used, the R, G and B signals are supplied to the data bus by the selection circuit.

33. An apparatus as defined by claim 15, and further comprising a data interface for connecting the apparatus with a data processing unit.

34. An apparatus as defined by claim 15, and further comprising a switching circuit for generating fixed and-/or variable scaling lines on the screen of the VDT.

35. An apparatus as defined by claim 15, and further comprising a selectively actuatable character generator.

36. An apparatus as defined by claim 15, and further comprising a circuit unit for the selective display of time and/or date on the screen of the VDT.

* * * * *